US006895344B2

(12) United States Patent
Ramaswamy

(10) Patent No.: US 6,895,344 B2
(45) Date of Patent: May 17, 2005

(54) EXTRACTING RESISTANCES FOR A SUBSTRATE NETWORK

(75) Inventor: Sridhar Ramaswamy, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 227 days.

(21) Appl. No.: 10/397,578

(22) Filed: Mar. 25, 2003

(65) Prior Publication Data

US 2004/0204876 A1 Oct. 14, 2004

(51) Int. Cl.[7] .............................................. G06F 17/50
(52) U.S. Cl. ............................. 702/57; 716/6; 716/19; 455/3.02
(58) Field of Search .............................. 702/57; 361/56, 361/581, 111; 331/16; 455/3.02, 3.306, 313, 319, 323; 257/295, 327, 347, 355, 358, 362, 369, 379, 752, E23.148, E27.024, E27.026, E27.049; 716/1, 2, 4, 8, 9, 19

(56) References Cited

U.S. PATENT DOCUMENTS

| 4,032,881 A | * | 6/1977 | Singleton ..................... 338/195 |
| 4,159,461 A | * | 6/1979 | Kost et al. ................... 338/195 |
| 4,338,351 A | * | 7/1982 | Bloom et al. ................... 427/8 |
| 5,945,833 A | * | 8/1999 | Mil'shtein et al. .......... 324/751 |
| 6,553,542 B2 | * | 4/2003 | Ramaswamy et al. ......... 716/2 |
| 2001/0029601 A1 | * | 10/2001 | Kimura et al. ................ 716/19 |
| 2003/0045263 A1 | * | 3/2003 | Wakayama et al. ......... 455/323 |
| 2004/0025128 A1 | * | 2/2004 | Galland et al. ................ 716/5 |
| 2004/0166799 A1 | * | 8/2004 | Kral .......................... 455/3.02 |

OTHER PUBLICATIONS

R. Gharpurey and R. Meyer, "Modeling and Analysis of Substrate Coupling in Integrated Circuits," IEEE Journal of Solid–State Circuits, vol. 31, No. 3, pp. 344–353, Mar. 1996.
R. Gharpurey and S. Hosur, "Transform Domain Techniques for Efficient Extraction of Substrate Parasitics," 1092–3152/97, 1997 IEEE.
A. Niknejad, R. Gharpurey, R. Meyer, "Numerically Stable Green Function for Modeling and Analysis of Substrate Coupling in Integrated Circuits," IEEE Transactions on Computer–Aided Design of Integrated Circuits and Systems, vol. 17, No. 4, pp. 305–315, Apr. 1998.

* cited by examiner

Primary Examiner—Carol Tsai
(74) Attorney, Agent, or Firm—Alan K. Stewart; W. James Brady, III; Frederick J. Telecky, Jr.

(57) ABSTRACT

Determining a substrate resistance network includes receiving a description of a substrate network including nodes. Elements of the substrate network are identified and associated with one or more nodes, where the elements include nwell structures. For each nwell structure, a ring geometry and area geometries result from dividing the nwell structure, where the area geometries represent an inward portion of the nwell structure and where each area geometry is associated with an area resistive element and an area coordinate. The ring geometry represents a perimeter portion of the nwell structure. Side geometries are formed from the ring geometry, each side geometry associated with a side resistive element. An nwell group is formed including the area geometries associated with the nwell structure in accordance with the area coordinates. An nwell resistance network is determined for each nwell group using the area resistive elements and the side resistive elements.

20 Claims, 3 Drawing Sheets

EXTRACTING RESISTANCES FOR A SUBSTRATE NETWORK

TECHNICAL FIELD OF THE INVENTION

This invention relates generally to the field of semiconductor design and more specifically to analyzing resistance for a substrate network.

BACKGROUND OF THE INVENTION

Application Specific Integrated Circuits (ASICs) use a large number of high-speed serial links to increase the quantity and quality of information being processed. Improving performance of the high-speed serial links typically requires managing link jitter. While link jitter may be generally low for high-speed serial links in isolation, the jitter, however, may increase if it is measured while the links are in proximity to an active circuit. Known techniques for managing jitter in an active circuit may involve estimating the generated noise coupling. One such technique may include a finite element method analysis, where the entire substrate must be discretized, resulting in very complex computation. Another technique includes boundary element method (BEM) analysis, where the discretizing may involve defining boundaries of the elements. These known techniques, however, may result in inaccurate quantification of coupling of supply noise. Consequently, known techniques for analyzing substrate coupling for high-speed serial links are unsatisfactory in certain situations.

SUMMARY OF THE INVENTION

In accordance with the present invention, disadvantages and problems associated with previous techniques for analyzing resistance for a substrate network may be reduced or eliminated.

According to one embodiment, determining a substrate resistance network includes receiving a description of a substrate network, where the substrate network includes nodes. Elements of the substrate network are identified and associated with one or more nodes, where the elements include nwell structures. For each nwell structure, a ring geometry and area geometries result from dividing the nwell structure, where the area geometries represent an inward portion of the nwell structure and where each area geometry is associated with an area resistive element and an area coordinate. The ring geometry represents a perimeter portion of the nwell structure. Side geometries are formed from the ring geometry, each side geometry associated with a side resistive element. An nwell group is formed including the area geometries associated with the nwell structure in accordance with the area coordinates. An nwell resistance network is determined for each nwell group using the area resistive elements and the side resistive elements.

Certain embodiments of the invention may provide one or more technical advantages. A technical advantage of one embodiment may be that by dividing the nwells into ring geometries and area geometries, the boundary element method may be useful in analyzing the resistance of substrate networks. Another technical advantage of an embodiment may be that the coupling of the supply noise of high-speed serial links may be quantified for substrate networks, which may be an effective tool in designing integrated circuits.

Certain embodiments of the invention may include none, some, or all of the above technical advantages. One or more other technical advantages may be readily apparent to one skilled in the art from the figures, descriptions, and claims included herein.

BRIEF DESCRIPTION OF THE DRAWINGS

For a more complete understanding of the present invention and its features and advantages, reference is now made to the following description, taken in conjunction with the accompanying drawings, in which.

DETAILED DESCRIPTION OF THE DRAWINGS

Embodiments of the present invention and its advantages are best understood by referring to FIGS. 1 through 4 of the drawings, like numerals being used for like and corresponding parts of the various drawings.

Figure 1:
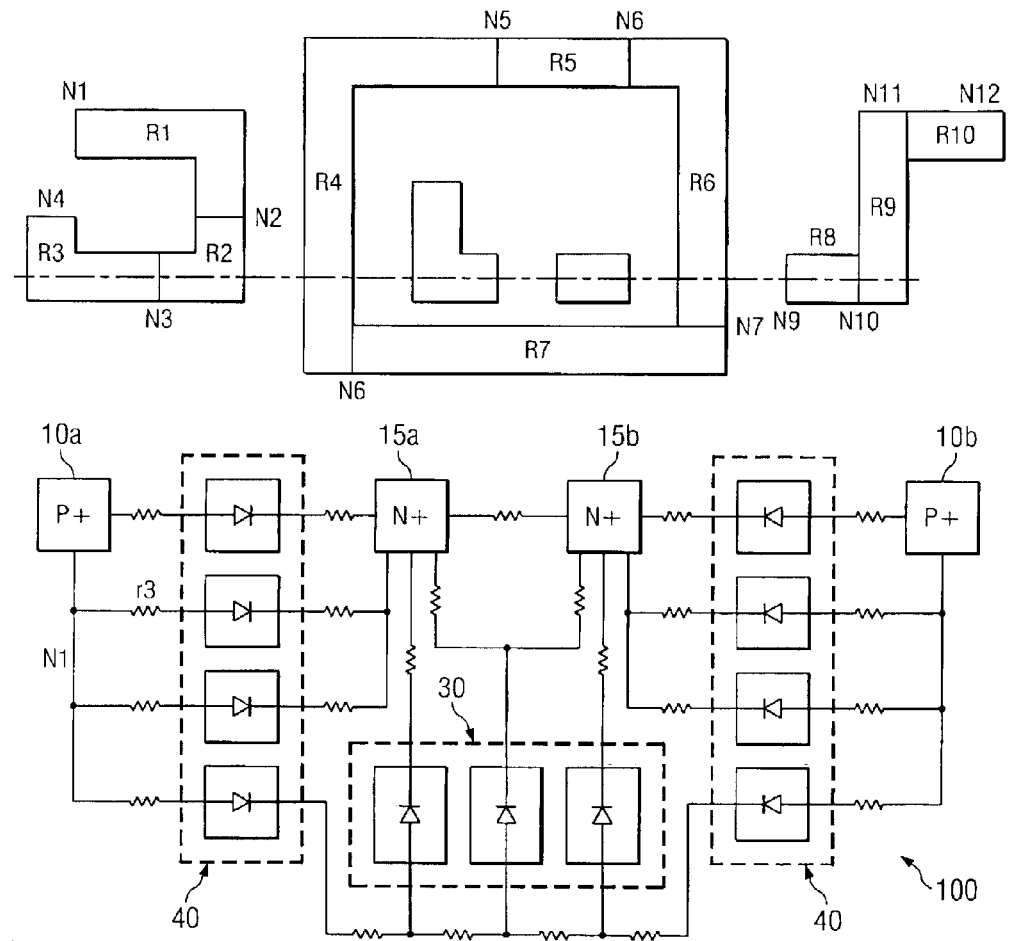
FIG. 1 is a diagram of one embodiment of a substrate network analyzed in accordance with the present invention.

FIG. 1 is a diagram illustrating one embodiment of a substrate network 100. Substrate network 100 may comprise parasitic elements, such as p-substrates 10 with p+ taps 10a and 10b, and nwell geometries 20 with n+ taps 15a and 15b. An nwell geometry is an interferer that substantially isolates the substrate portions within the nwell from the substrate elements outside the nwell. The parasitic elements are treated as nodes in the substrate network 100 to allow for the resistive paths between the nodes to be extracted. Nwell 20 is divided into nwell ring geometries 40 and area geometries 30 to simulate the noise coupling effect of nwell interferors in a substrate network.

Substrate network 100 may comprise any suitable configuration of p-substrates 10 and nwells 20 without departing from the scope of the invention. Additionally, any suitable number of nwells 20 may be included in the substrate network 100 without departing from the scope of the invention.

A block diagram illustrating one embodiment of a system for analyzing a resistance network is described with reference to FIG. 2. A flowchart illustrating one embodiment of the method for extracting geometries at a substrate network is described with reference to FIG. 3. A flowchart illustrating one embodiment of a method for analyzing a resistance network of a substrate is described with reference to FIG. 4. An embodiment of a method for a trinary tree sorting technique is described with reference to FIG. 5. Additionally, functions may be performed using any suitable logic comprising software, hardware, other logic, or any suitable combination of the preceding. As used in this document, "each" refers to each member of a set or each member of a subset of a set.

Figure 2:
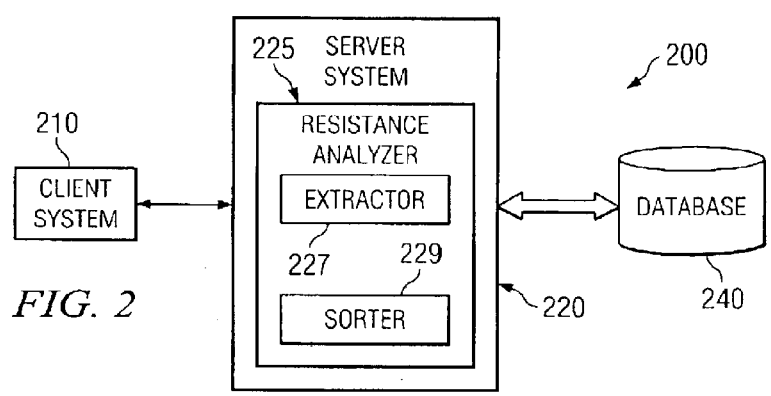
FIG. 2 is a block diagram illustrating one embodiment of a system that may be used to determine resistance of a substrate network in accordance with the present invention.

FIG. 2 is a block diagram illustrating one embodiment of a system 200 for analyzing resistance for a substrate network 100. According to the illustrated embodiment, system 200 includes client system 210, server system 220, and database 240, coupled as shown in FIG. 1.

According to one embodiment, client system 210 allows a user to communicate with a server system 220 to retrieve substrate network data from database 240, and analyze the resistance of substrate network 100 using a resistance analyzer 225. Typically, client system 210 and server system 220 may each operate on one or more computers and may include appropriate input devices, output devices, mass storage media, processors, memory, or other components for receiving, processing, storing, and communicating information according to the operation of system 200. As used in this document, the term "computer" refers to any suitable device operable to accept input, process the input according to predefined rules, and produce output, for example, a personal computer, workstation, network computer, wireless telephone, personal digital assistant, one or more microprocessors within these or other devices, or any other suitable processing device.

Client system 210 and server system 220 may be integrated or separated according to particular needs. For example, the present invention contemplates the functions of both client system 210 and server system 220 being provided using a single computer system, for example, a single personal computer. If client system 210 and server system 220 are separate, client system 210 may be coupled to server system 220 using one or more local area networks (LANs), metropolitan area networks (MANs), wide area networks (WANs), a global computer network such as the internet or any other appropriate wireline, wireless, or other suitable links. Server system 220 manages the applications that extract the geometries of substrate network 100, and analyzes the resistance of substrate network 100. Server system 220 includes a resistance analyzer 225.

Resistance analyzer 225 may include an application layer operable to analyze substrate network 100 to calculate a resistance between at least two nodes of the substrate network 100. Resistance analyzer 225 may comprise an extractor 227 and a sorter 229.

Extractor 227 identifies the elements of substrate network 100, generates data associated with each element, and extracts a substrate resistance network and an nwell resistance network to generate substrate network 100. According to one embodiment, extractor 227 identifies the nodes associated with the p+ diffusions, n+ diffusions, and nwells of substrate network 100, and generates data for each node. The data may include characteristics of the node, such as the element associated with the node, the coordinates of the node, layer information, or some, none, or all of the preceding. According to one embodiment, extractor 227 may store the data in database 240. Any other suitable data may be generated by extractor 227 without departing from the scope of the invention.

Extractor 227 extracts at least one resistive element for each node to generate a substrate resistance network. A resistive element may include a resistor or any other suitable circuit element that may be used to represent electrical characteristics of substrate network 100. Each resistive element may be associated with a resistance value, a pair of circuit nodes, and a location parameter.

According to the illustrated embodiment, a p+ tap 10*a* represents a node of the substrate resistance network, where a node may be defined using an (x, y) coordinate and associated with at least one resistor determined using a rule-based parasitic extractor, such as the Chameleon-LV software by K2 Technologies, Inc. For example, p+ tap 10*a*, may be identified as node n1, having a particular set of (x,y) coordinates, and may be associated with at least one resistance r3. Any suitable number of resistive elements may be extracted for each node without departing from the scope of the invention.

Extractor 227 extracts nwell geometries by dividing the nwell structure into discrete portions of the nwell structure. For example, nwell 40 may be divided into a plurality of nwell ring geometries 40 and a plurality of nwell area geometries 30. The ring geometries 40 may define the perimeter of the nwell, while the area geometries 30 may define the inward portion of the nwell. Extractor 227 is operable to associate a node and a location parameter for each ring geometry 40 and each area geometry 30.

Extractor 227 generates a p-substrate resistance network and an nwell resistance network to determine a substrate network 100. Extractor 227 determines a schematic of the p-substrate resistance network with the resistive elements associated with the nodes of p-substrates outside the nwell and the nodes of the ring geometries 40 and area geometries 30.

According to the illustrated embodiment, extractor 227 determines a schematic of an nwell resistance network using the resistive elements associated with the nodes of the nwell ring geometries 40 and area geometries 30 coupled to the n+ taps that may be included within the nwell. Extractor 227 may couple the nwell resistance network with the p-substrate resistance network to form substrate network 100, which, as shown in FIG. 1, identifies the ring geometry nodes and area geometry nodes as diodes in a schematic that may be further simplified by sorter 229.

Sorter 229 uses a modified binary tree procedure adapted to minimize the number of nodes of substrate network 100. According to the illustrated embodiment, sorter 229 compares the nodes of each resistive element to root nodes. For example, a resistive element with nodes N1 and N2 is compared with at least one node of a previous resistive element to determine if the at least one node matches any of the nodes of the new element. This procedure produces a tree of root nodes of substrate network 100 by associating each resistive element with a root node until all root nodes are identified. The tree is reduced to decrease the number of nodes. The procedure may minimize the number of nodes of substrate network 100 by performing the procedure recursively until the root nodes may not be associated with any other node. Sorter 29 may use any other suitable sorting procedure to sort and store the list of nodes without departing from the scope of the invention. According to the illustrated embodiment, sorter 229 performs a tri-nary tree procedure as more particularly described by FIG. 5 until substrate network 100 has been simplified to comprise a minimum number of nodes. Typically, less than four iterations are used to get a minimum number of nodes using the try-nary tree procedure. Any number of iterations however, may be performed by sorter 229 without departing from the scope of the invention.

A database 240 stores data that may be used by server system 220. Database 240 may be local to or remote from server system 220, and maybe coupled to server system 220 using one or more local area networks (LANs), metropolitan area networks (MANs), wide area networks (WANs), a global computer network such as the Internet, or any other appropriate wireline, wireless, or other links. Database 240 may include, for example, p-substrate data, n-substrate data, nwell data, including nwell ring geometries data and nwell area geometries data. Database 240 may also include node and coordinates information, resistance value for each resistive element, and a location parameter associated with each resistive element of substrate network 100. Any other suitable parameters may be stored at database 240 without departing from the scope of the invention.

Various modifications, additions, or omissions may be made to system 200 without departing from the scope of the invention. For example, resistance analyzer 225 may include additional modules to analyze the resistance of substrate network 100. As one example of such module, resistance analyzer 225 may include a geometry converter for converting polygonal geometries to rectangular geometries.

Figure 3:
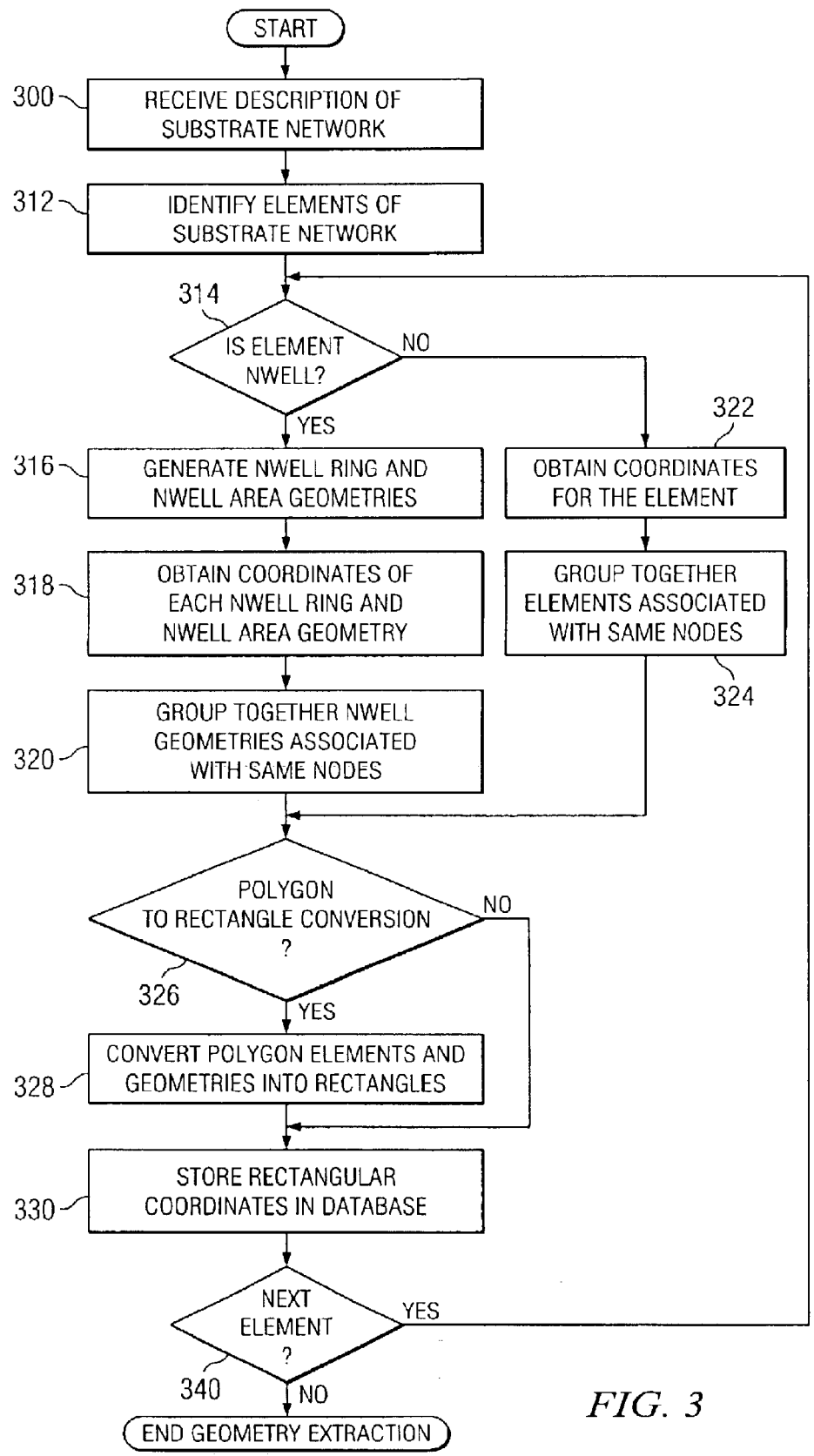
FIG. 3 is a flowchart illustrating one embodiment of a method for extracting geometries of a resistance substrate network.

FIG. 3 is a block diagram illustrating a method for extracting geometries of a substrate network 100. The method begins at step 300, where a resistance analyzer 225 receives a description of substrate network 100. According to the illustrated embodiment, resistance analyzer 225 receives coordinate information for each parasitic layer, which may comprise a p-substrate, an n-substrates, or nwell. Each parasitic layer, however, may be modified to define each element of substrate network 100. For example, p-substrates, n-substrates, and nwell layers may each be defined as an element. Any suitable description of substrate network 100 may be received by resistance analyzer 225 without departing from the scope of the invention.

The method proceeds to step 312, where resistance analyzer 225 identifies the elements of substrate network 100. The elements may be identified as p-substrates, n-substrates, and nwell elements. At step 314, a determination is made whether an element is an nwell.

If the element is an nwell at step 314, the method proceeds to step 316, where nwell rings and nwell area geometries are generated for the nwell. According to the illustrated embodiment the nwell geometry is divided into ring geometries 40 that define the perimeter of the nwell, and area geometries 30 that define the inward area of the nwell. Ring geometries 40 may comprise one or more diode elements, which may be coupled to proximate elements via resistive elements. Area geometries 30 may comprise one or more diode elements coupled to proximate elements via resistive elements. Area geometries 30 may also be further divided into a grid pattern. Each grid may form a rectangular geometry and each rectangular geometry may be associated with the same potential. According to one embodiment, the area geometries 30 may be formed into 0.2 microns squared in area. Any other suitable division of area geometries 30 may be used without departing from the scope of the invention.

The method proceeds to step 318, where rectangular coordinates are obtained for each ring geometry 40 and area geometry 30. Extractor 227 obtains the coordinates and data associated with each ring geometry 40 and area geometry 30, where the data may include node information, resistive elements associated with the nodes, layout location information, or some, none, or all of the preceding.

At step 320, the coordinates and data for the area geometries are analyzed to group together the area geometries that are associated with substantially the same node. In general, each element of substrate network 100 is associated with at least one node. The nodes of the area geometries 30 of an nwell node are compared and grouped together to form one nwell group comprising the area geometries 30 associated with the nwell node. According to one embodiment, extractor 227 may also group together ring geometries 40 that define the perimeter of a particular nwell. Any suitable grouping technique may be used to form the nwell group without departing from the scope of the invention.

If the element is not an nwell at step 314, the method proceeds to step 322, where the coordinates for the element are obtained. According to one embodiment, if an element is a p-substrate or an n-substrate, extractor 227 obtains the coordinates for each element.

Extractor 227 groups together elements associated with the same nodes at step 324. According to one embodiment, a p-substrate group may be formed by grouping together p-substrates sharing the same circuit node.

The method proceeds to step 326 to determine if a polygonal geometry needs to be converted to a rectangular geometry. According to the illustrated embodiment, each element having a polygonal geometry may be broken into its constitutive rectangular geometries, at step 328. If the element is not a polygonal geometry, the method proceeds to step 330 to store the coordinates in database 240.

If no polygonal geometries need conversion at step 326, the method proceeds to step 330, where the coordinates of the element and its associated geometries are stored in database 240. If there is a next element to process at step 340, the method returns to step 314 to determine if the next element is an nwell. If there is no next element to process at step 340, geometry extraction terminates.

Step may be added, omitted, modified, or performed in any suitable order without departing from the scope of the invention. For example, a step may be added before conversion at step 326, where a sorter 229 sorts the nodes of each element to minimize the number of nodes. As another example, storing coordinates in database 240 at step 330 may be omitted.

Figure 4:
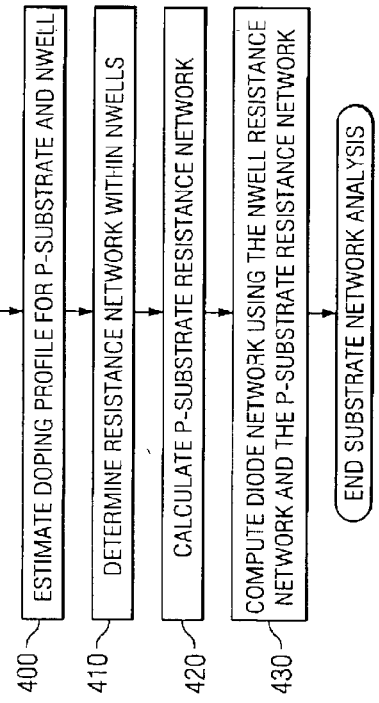
FIG. 4 is a flowchart illustrating one embodiment of a method for analyzing resistance of a substrate network.

FIG. 4 is a flowchart illustrating one embodiment of a method for analyzing a resistance network of a substrate network 100. The method begins at step 400 where resistance analyzer 225 estimates a doping profile for the substrate. According to one embodiment, a doping profile obtained from a process simulation tool may be transformed to a discretized resistivity using Equation (1):

$$\rho := \frac{1}{qN\mu} \quad (1)$$

where $\rho$ is the resistivity of a layer with doping concentration N and mobility $\mu$, and where q is the charge constant representing $1.6 \times 10^{-19}$ Coulombs. According to another embodiment, if a doping concentration varies significantly within a region, then the doping concentration N may be obtained by using Equation (2):

$$|N| := \frac{\int_{z_1}^{z_2} N(z)\,dz}{(z_2 - z_1)} \quad (2)$$

where N is a function of Z, the depth in the substrate between depths $Z_2$ and $Z_1$. Typically, the mobility $\mu$ is a function of doping concentration and can be obtained from tables or using standard formulae well known in the industry. According to the illustrated embodiment, the impact of shallow trench isolation (STI) may be accounted for by adjusting the origin of the resistivity profiles. Any other suitable equation or tool may be used to estimate a doping profile for the substrate without departing from the scope of the invention.

The method proceeds to step 410, where resistance analyzer 225 determines a resistance network within the nwell nodes. A resistance network may be determined using the boundary element method (BEM), by solving the electrostatic integral equation using a Green's function. The nwellS are divided into ring geometries 40 and area geometries 30 that can be used with the boundary element method to extract the resistance network in the substrate. The resistance network may include the ring geometries 40 forming the nwell perimeter and the area geometries 30 forming the inward portions of the nwell nodes. For example, the resistances between the nwell perimeter and the bottom contacts may be ignored since they may be considered open circuits.

The method proceeds to step 420, where resistance analyzer 225 calculates a p-substrate resistance network. The p-substrate resistance network includes the p-substrate elements coupled with the ring geometries 40 that form the nwell perimeter.

At step 430, resistance analyzer 225 computes a diode network using the resistance network and the p-substrate resistance network. According to the illustrated embodiment, the resistance network determined at step 410 is coupled with the p-substrate resistance network calculated at step 420 to form a substrate network 100. Once substrate network 100 is generated, resistance analyzer 225 may utilize the doping profile for the substrate together with the three-dimensional Poisson's equations to yield a final resistance matrix indicating the impedance between the contacts being analyzed. Any substrate resistance extractor program may be used to compute substrate network 100 using the doping profile. For example, the network may be analyzed using MATHCAD to simulate and analyze a substrate network. After computing the diode network at step 430, the method terminates.

Steps may be added, omitted, modified, or performed in any suitable order without departing from the scope of the invention. For example, calculating the p-substrate resistance network at step 420 may be performed before the nwell resistance network is determined at step 410. As another example, calculating the p-substrate resistance network at step 420 may be modified so that the p-substrate resistance is extracted using the entire substrate including the nwell perimeter and bottom but ignoring the contacts between the nwell perimeter and bottom.

Figure 5:
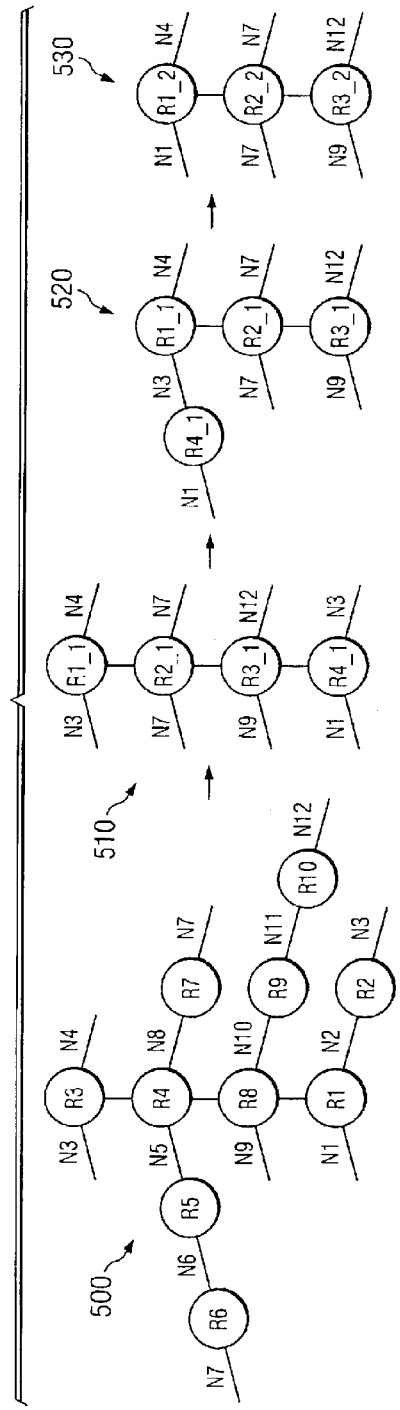
FIG. 5 illustrates one embodiment of a method for a trinary tree sorting technique.

FIG. 5 illustrates one embodiment of a method for a trinary tree sorting procedure. The trinary tree sorting may be performed by first accessing at database 240 data corresponding to each resistive element of substrate 100. For example, database 240 may include data describing a series of resistive elements R3, R4, R7, R5, R6, R8, R9, R1, R10, and R2 and their corresponding nodes shown in FIG. 1. Sorter 229 identifies a first resistive element of the series to begin the sorting procedure. Sorter 229 may, however, begin with any resistive element in the series. According to the illustrated example, sorter 229 identifies the data of the first resistive element R3 of the series.

Sorter 229 creates a root node tree 500 by determining the nodes associated with the first resistive element of the series. According to the illustrated embodiment, sorter 229 identifies nodes N3 and N4 as being associated with R3 and establishes R3 as the first root of root node tree 500.

Sorter 229 sorts the next resistive element by identifying the next resistive element of the series and comparing the nodes of the next resistive element with the end nodes of root node tree 500. The end nodes are nodes that are associated with only one resistive element. According to the illustrated embodiment, sorter 229 identifies R4 as the next resistive element and compares nodes N5 and N8 with end nodes N3 and N4. If sorter 229 determines that the nodes of the next resistive element do not correspond to the end nodes of root node tree 500, the next resistive element is added in tandem as a root to root node tree 500. For example, R4 is added as a root to root node tree 500 when sorter 229 determines that nodes N5 and N8 do not match the end nodes.

Sorter 229 sorts subsequent resistive elements as they are found in database 240 and adds them to root node tree 500. For example, the next resistive element R7 has nodes N8 and N7 that are compared with end nodes such as the nodes of root R3. After determining that the R7 nodes do not match with the R3 nodes, sorter 229 compares the R7 nodes with the nodes of root R4. Node N8 is determined to correspond to both R7 and R4, so sorter 229 associates R7 with root R4. Sorter 229 similarly sorts the next resistive element R5 having node N5 matching with root R4.

Sorter 229 continues sorting remaining resistive elements until the resistive elements of the series are either identified as roots or associated with a root. For example, sorter 229 continues the sorting process until it reaches the last resistive element R2 in the series. Any number of resistive elements may be sorted by sorter 229 without departing from the scope of the invention.

A first iteration is performed by sorter 229 to minimize the number of nodes of first root node tree 500 to generate a second root node tree 510. The first iteration begins with sorter 229 identifying a first root of root node tree 500 and collapsing the branches of the first root to its end nodes. For example, first root R3 has end nodes N3 and N4. Therefore, sorter 229 forms a second root node tree 510 with a first root R1_1 having end nodes N3 and N4. $R_{x\_y}$, where x represents the root and y represents the iteration, may be used. For example, R2_1 describes the second root of second root of the first iteration with end nodes end nodes N7 and N7. Similarly, R3_1 represents the third root node of the first iteration with end nodes N9 and N12. Sorter 229 continues collapsing the branches of root node tree 500 to form second root node tree 510. Any suitable number of nodes may be sorted in the first iteration and any suitable nomenclature may be used to identify the nodes of second root node tree 510 without departing from the scope of the invention.

Sorter 229 may perform a second iteration to further minimize the number of nodes of second root node tree 510. Sorter 229 identifies root nodes of second root node tree 510 that may have nodes associated with other root nodes of second root node tree 510. For example, sorter 229 may determine that root node R4_1 having nodes N1 and N3 has node N3 in common with root node R1_1. The second iteration may yield a third root node tree 520 where the root nodes have been identified and sorted according to the common nodes they share. For example, third root node tree 520 depicts the association of root node R4_1 with root node R1_1 via their common node N3. Sorter 229 sorts through the remaining root nodes of second root node tree 510 until all root nodes are compared and associated if applicable.

According to the illustrated embodiment, sorter 229 collapses the branches associated at third root node tree 520 to complete the second iteration process. For example, fourth root node tree 530 is formed by collapsing the branches as described previously with respect to second root node tree 510. In the illustrated example, a first root node of the second iteration R1_2 with end nodes N1 and N4 may be generated by collapsing the association of R4_1 with R1_1 of third root node tree 520. A fourth root node 530 results after collapsing the root nodes of third root node tree 520. Although in the illustrated example, two iterations are performed to reduce the number of root nodes to the minimum number of root nodes, any number of iterations may be performed by sorter 229 without departing from the scope of the invention.

Certain embodiments of the invention may provide one or more technical advantages. A technical advantage of one embodiment may be that by dividing the nwells into ring geometries and area geometries, the boundary element method may be useful in analyzing resistant of substrate

What is claimed is:

1. A method for determining a substrate resistance network, comprising:

receiving a description of a substrate network, the substrate network comprising a plurality of nodes;

identifying a plurality of elements of the substrate network, each element associated with one or more nodes, the plurality of elements comprising a plurality of nwell structures; and repeating the following for each nwell structure of the plurality of nwell structures:

dividing the nwell structure to yield a ring geometry and a plurality of area geometries, the plurality of area geometries representing an inward portion of the nwell structure, each area geometry associated with an area resistive element and at least one area coordinate, the ring geometry representing a perimeter portion of the nwell structure;

forming a plurality of side geometries from the ring geometry, each side geometry associated with a side resistive element;

forming an nwell group comprising the plurality of area geometries associated with the nwell structure in accordance with the area coordinates; and determining an nwell resistance network for each nwell group using the area resistive elements and the side resistive elements.

2. The method of claim 1, wherein the plurality of elements comprises a plurality of p-substrates, and further comprising repeating the following for each p-substrate:

extracting a plurality of layer geometries of a p-substrate, each layer geometry associated with at least one layer resistive element and at least one node;

determining that the at least one layer resistive element and at least one side geometry share substantially the same node;

forming a p-substrate group comprising the at least one layer geometry and the at least one side geometry; and generating a p-substrate resistance network using the p-substrate group.

3. The method of claim 2, further comprising generating a diode network by coupling the nwell resistance networks and the p-substrate resistance networks.

4. The method of claim 1, wherein:

an area geometry of the nwell structure comprises a polygon geometry;

forming the nwell group further comprises fragmenting the area geometry into a plurality of rectangular geometries, each rectangular geometry associated with at least one first resistive element and a first set of coordinates; and determining the nwell resistance network further comprises determining the nwell resistance network according to the first set of coordinates and the first resistive elements.

5. The method of claim 1, wherein forming an nwell group further comprises determining connective nodes by:

generating a root node tree, the root node tree comprising the nodes associated with the elements of the substrate network;

grouping the nodes according to at least one node shared by one or more elements; and reducing the root node tree to a minimum number of nodes.

6. The method of claim 1, wherein determining the nwell resistance network further comprises:

generating a doping profile for a substrate associated with the nwell resistance network; and determining a discretized resistivity profile from the doping profile.

7. A system for determining a substrate resistance network, comprising:

a database operable to store data corresponding to a description of a substrate network; and a processor operable to:

receive the description of a substrate network, the substrate network comprising a plurality of nodes;

identify a plurality of elements of the substrate network, each element associated with one or more nodes, the plurality of elements comprising a plurality of nwell structures; and repeat the following for each nwell structure of the plurality of nwell structures:

divide the nwell structure to yield a ring geometry and a plurality of area geometries, the plurality of area geometries representing an inward portion of the nwell structure, each area geometry associated with an area resistive element and at least one area coordinate, the ring geometry representing a perimeter portion of the nwell structure;

form a plurality of side geometries from the ring geometry, each side geometry associated with a side resistive element;

form an nwell group comprising the plurality of area geometries associated with the nwell structure in accordance with the area coordinates; and determine an nwell resistance network for each nwell group using the area resistive elements and the side resistive elements.

8. The system of claim 7, wherein:

the plurality of elements comprises a plurality of p-substrates, and the processor is further operable to:

extract a plurality of layer geometries of a p-substrate, each layer geometry associated with at least one layer resistive element and at least one node;

determine that the at least one layer resistive element and at least one side geometry share substantially the same node;

form a p-substrate group comprising the at least one layer geometry and the at least one side geometry; and generate a p-substrate resistance network using the p-substrate group.

9. The system of claim 8, wherein the processor is further operable to generate a diode network by coupling the nwell resistance networks and the p-substrate resistance networks.

10. The system of claim 7, wherein:

an area geometry of the nwell structure comprises a polygon geometry;

the processor is further operable to:

fragment the area geometry into a plurality of rectangular geometries, each rectangular geometry associated with at least one first resistive element and a first set of coordinates; and determine the nwell resistance network according to the first set of coordinates and the first resistive elements.

11. The system of claim 7, wherein the processor is further operable to determine connective nodes by:

generating a root node tree, the root node tree comprising the nodes associated with the elements of the substrate network;

grouping the nodes according to at least one node shared by one or more elements; and reducing the root node tree to a minimum number of nodes.

12. The system of claim 7, wherein the processor is further operable to determine the nwell resistance by:

generating a doping profile for a substrate associated with the nwell resistance network; and determining a discretized resistivity profile from the doping profile.

13. A logic embodied in a computer readable medium and operable to:

receive a description of a substrate network, the substrate network comprising a plurality of nodes;

identify a plurality of elements of the substrate network, each element associated with one or more nodes, the plurality of elements comprising a plurality of nwell structures; and repeat the following for each nwell structure of the plurality of nwell structures:

dividing the nwell structure to yield a ring geometry and a plurality of area geometries, the plurality of area geometries representing an inward portion of the nwell structure, each area geometry associated with an area resistive element and at least one area coordinate, the ring geometry representing a perimeter portion of the nwell structure;

forming a plurality of side geometries from the ring geometry, each side geometry associated with a side resistive element;

forming an nwell group comprising the plurality of area geometries associated with the nwell structure in accordance with the area coordinates; and determining an nwell resistance network for each nwell group using the area resistive elements and the side resistive elements.

14. The logic of claim 13, wherein the plurality of elements comprises a plurality of p-substrates, and further comprising repeating the following for each p-substrate:

extracting a plurality of layer geometries of a p-substrate, each layer geometry associated with at least one layer resistive element and at least one node;

determining that the at least one layer resistive element and at least one side geometry share substantially the same node;

forming a p-substrate group comprising the at least one layer geometry and the at least one side geometry; and generating a p-substrate resistance network using the p-substrate group.

15. The logic of claim 14, further operable to generate a diode network by coupling the nwell resistance networks and the p-substrate resistance networks.

16. The logic of claim 13, wherein:

an area geometry of the nwell structure comprises a polygon geometry;

forming the nwell group further comprises fragmenting the area geometry into a plurality of rectangular geometries, each rectangular geometry associated with at least one first resistive element and a first set of coordinates; and determining the nwell resistance network further comprises determining the nwell resistance network according to the first set of coordinates and the first resistive elements.

17. The logic of claim 13, wherein forming an nwell group further comprises determining connective nodes by:

generating a root node tree, the root node tree comprising the nodes associated with the elements of the substrate network;

grouping the nodes according to at least one node shared by one or more elements; and reducing the root node tree to a minimum number of nodes.

18. The logic of claim 13, wherein determining the nwell resistance network further comprises:

generating a doping profile for a substrate associated with the nwell resistance network; and determining a discretized resistivity profile from the doping profile.

19. A system for determining an nwell resistance network, comprising:

means for receiving a description of a substrate network, the substrate network comprising a plurality of nodes;

means for identifying a plurality of elements of the substrate network, each element associated with one or more nodes, the plurality of elements comprising a plurality of nwell structures; and means for repeating the following for each nwell structure of the plurality of nwell structures:

dividing the nwell structure to yield a ring geometry and a plurality of area geometries, the plurality of area geometries representing an inward portion of the nwell structure, each area geometry associated with an area resistive element and at least one area coordinate, the ring geometry representing a perimeter portion of the nwell structure;

forming a plurality of side geometries from the ring geometry, each side geometry associated with a side resistive element;

forming an nwell group comprising the plurality of area geometries associated with the nwell structure in accordance with the area coordinates; and determining an nwell resistance network for each nwell group using the area resistive elements and the side resistive elements.

20. A system for determining an nwell resistance network, comprising:

an database operable to store data corresponding to a description of a substrate network; and a processor operable to:

receive the description of the substrate network, the substrate network comprising a plurality of nodes;

identify a plurality of elements of the substrate network, each element associated with one or more nodes, the plurality of elements comprising a plurality of structures, each structure selected from a group consisting of a plurality of nwell structures and a plurality of p-substrates; and repeat the following for each structure:

divide the nwell structure to yield a ring geometry and a plurality of area geometries, the plurality of area geometries representing an inward portion of the nwell structure, each area geometry associated with an area resistive element and at least one area coordinate, the ring geometry representing a perimeter portion of the nwell structure;

fragment the area geometry into a plurality of rectangular geometries for each area geometry comprising a polygonal geometry, each rectangular geometry associated with at least one first resistive element and a first set of coordinates;

form a plurality of side geometries from the ring geometry, each side geometry associated with a side resistive element;

form an nwell group comprising the plurality of area geometries associated with the nwell structure in accordance with the area coordinates;

determine an nwell resistance network for each nwell group using the area resistive elements and the side resistive elements and according to the first set of coordinates and the first resistive elements;

extract a plurality of layer geometries of a p-substrate, each layer geometry associated with at least one layer resistive element and at least one node;

determine that the at least one layer resistive element and at least one side geometry share substantially the same node;

determine connective nodes by generating a root node tree, the root node tree comprising the nodes associated with the elements of the substrate network;

group the nodes according to at least one node shared by one or more elements;

reduce the root node tree to a minimum number of nodes;

form a p-substrate group comprising the at least one layer geometry and the at least one side geometry;

generate a p-substrate resistance network using the p-substrate group; and generate a diode network by:
    coupling the nwell resistance networks and the p-substrate resistance networks;
    generating a doping profile for a substrate associated with the network; and
    determining a discretized resistivity profile from the doping profile.

* * * * *